United States Patent [19]
Molinaro

[11] Patent Number: 5,100,190
[45] Date of Patent: Mar. 31, 1992

[54] WAFER CARRIER HOLDER FOR WAFER CARRIERS

[75] Inventor: James Molinaro, Coplay, Pa.

[73] Assignee: SubMicron Systems, Inc., Allentown, Pa.

[21] Appl. No.: 438,024

[22] Filed: Nov. 20, 1989

[51] Int. Cl.⁵ .............................................. B65D 71/00
[52] U.S. Cl. ..................................... 294/1.1; 294/27.1; 294/87.1; 294/159
[58] Field of Search ............... 294/1.1, 15, 16, 26.5, 294/27.1, 32, 67.1, 87.1, 137, 141–144, 146, 159–164, 167, 172; 118/500; 206/454–456, 557, 564; 211/40, 41, 126; 220/94 R; 901/30, 50

[56] References Cited
U.S. PATENT DOCUMENTS

| | | | |
|---|---|---|---|
| D. 282,146 | 1/1986 | Wallin et al. | 294/159 X |
| 2,312,256 | 2/1943 | Lumley | 294/159 |
| 3,592,500 | 7/1971 | Setzler | 294/27.1 |
| 3,599,828 | 8/1971 | Conway et al. | 294/160 |
| 3,747,774 | 7/1973 | Kulik | 294/162 X |
| 3,830,417 | 8/1974 | Montesi | 294/159 X |
| 3,923,191 | 12/1975 | Johnson | 294/16 X |
| 3,939,973 | 2/1976 | Wallestad | 294/27.1 X |
| 4,195,871 | 4/1980 | Chilton et al. | 294/16 |
| 4,520,934 | 6/1985 | Aigo | 294/159 X |
| 4,735,313 | 4/1988 | Schoenberg | 294/159 X |
| 4,762,353 | 8/1988 | Molinaro | 294/1.1 |

*Primary Examiner*—Johnny D. Cherry
*Attorney, Agent, or Firm*—Hugh D. Jaeger

[57] ABSTRACT

Low profile self-draining wafer carrier holder for gripping and carriage of semiconductor wafer carriers through robotically, automated or manual processing equipment. Opposing members extend horizontally from a central base with gripping fingers at outer extremities to grip wafer carriers for automatic processing. A handle member extends vertically from the central base member, and includes a handle member for accommodation by robotic end effectors. Beveled and angled surfaces in a preferred one-piece construction aid in accelerated fluid chemical runoff.

1 Claim, 5 Drawing Sheets

WAFER CARRIER HOLDER FOR WAFER CARRIERS

BACKGROUND OF THE INVENTION

1. Field of the Invention

The present invention pertains to a wafer carrier holder used for the processing of semiconductor wafers or substrates, and more particularly, relates to a wafer carrier holder for carriage of wafer or substrate carriers through and from various stages of semiconductor processing and fabrication.

2. Description of the Prior Art

Processing and handling of expensive wafer or substrate carriers is problematic due to the fragility and brittleness of the materials being processed.

By example and for purposes of illustration only and not to be construed as limiting of the present invention, a large number of circular semiconductor wafers are processed in groups or batches through various stages of manufacturing or processing in wafer carriers. The wafer carriers include a polymer framework in which a quantity of opposing grooves accommodate a quantity of individual wafers or substrates which are subsequently dipped, sprayed or rinsed by chemical solutions, or dipped therein and subsequently sprayed, rinsed and dried as part of the manufacturing process. Contamination by humans and other environs is kept at a minimum by the use of automatic processing equipment whereby the wafer carriers holding the semiconductor wafers or substrates are held by a wafer cassette holder. The wafer carrier holder containing the wafer carriers with wafers therein is then robotically or manually gripped and held by end effectors for carriage and transfer of the wafer carrier holder device to successive stages of processing.

In the prior art holders, certain problems existed during processing where the members and the holders in particular were of a high profile, thus preventing proper and full exposure of the wafers or substrates to chemical spray or rinsing spray during processing. Other problems also surfaced due to poor drainage of process solutions where solutions did not drain from the carrying structure and were carried into a subsequent processing area. A representative prior art holder is U.S. Pat. No. 4,762,353 issued Aug. 9, 1988, to Molinaro.

The present invention overcomes the disadvantages of the prior art by providing a minimum profile wafer carrier holder for the carriage of wafer carriers which includes angled and beveled surfaces for the maximizing of runoff.

SUMMARY OF THE INVENTION

The general purpose of the present invention is a one-piece low profile wafer carrier holder for gripping and carrying semiconductor wafer or substrate carriers through semiconductor processing or fabrication.

According to one embodiment of the present invention, the wafer carrier holder includes a central base with members extending horizontally therefrom to provide support for opposing fingered carrier gripping members. A "T"-handle with opposing angled undersides is located at the upper end of one vertical extension for accommodation of wafer carriers by end effectors. Beveled surfaces throughout assist in chemical run-off from near horizontal surfaces of the present invention. The present invention is of a low profile and minimum cross section, and one piece, which optimizes exposure of the wafer carriers to the processing or fabricating, as well as maximizing run off and eliminates chemical entrapment.

According to another embodiment of the present invention, there is provided a wafer carrier holder including a central base member with members extending both horizontally and vertically therefrom. Opposing "U" shaped fingered members are located at each outer extreme end of the horizontal extending members to form opposing wafer carriers accommodation slots between the "U" shaped members and the horizontally extending members. The top of the "U" shaped member and the top of the horizontally extending members are on the same plane and angled to aid in chemical runoff. A handle with opposing angled "V" bottom drain assisting surfaces is located in the upper regions of the upper vertically extending member. The handle accommodates the end effector of robotic handling equipment or manual pickup equipment. Other surfaces are beveled or chamfered to assist in chemical runoff.

Significant aspects and features of the present invention include a wafer carrier holder which is of one piece of polymer and of a low profile to aid in runoff of processing fluids.

Another significant aspect and feature of the present invention is that the one-piece structure contains no joints which can entrap processing fluids.

Having thus described embodiments of the present invention, it is the principal object hereof to provide a wafer carrier holder for gripping, grasping and carrying of semiconductor wafer or substrate holders through semiconductor processing or fabrication.

One object of the present invention is a low profile, one-piece wafer carrier holder.

Another object of the present invention is a self-draining wafer carrier holder.

A further object of the present invention is a wafer carrier holder which is robotic or manually compatible.

Another object of the present invention is the eliminator of chemical entrapment in the joints of the unit due to the one-piece construction.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
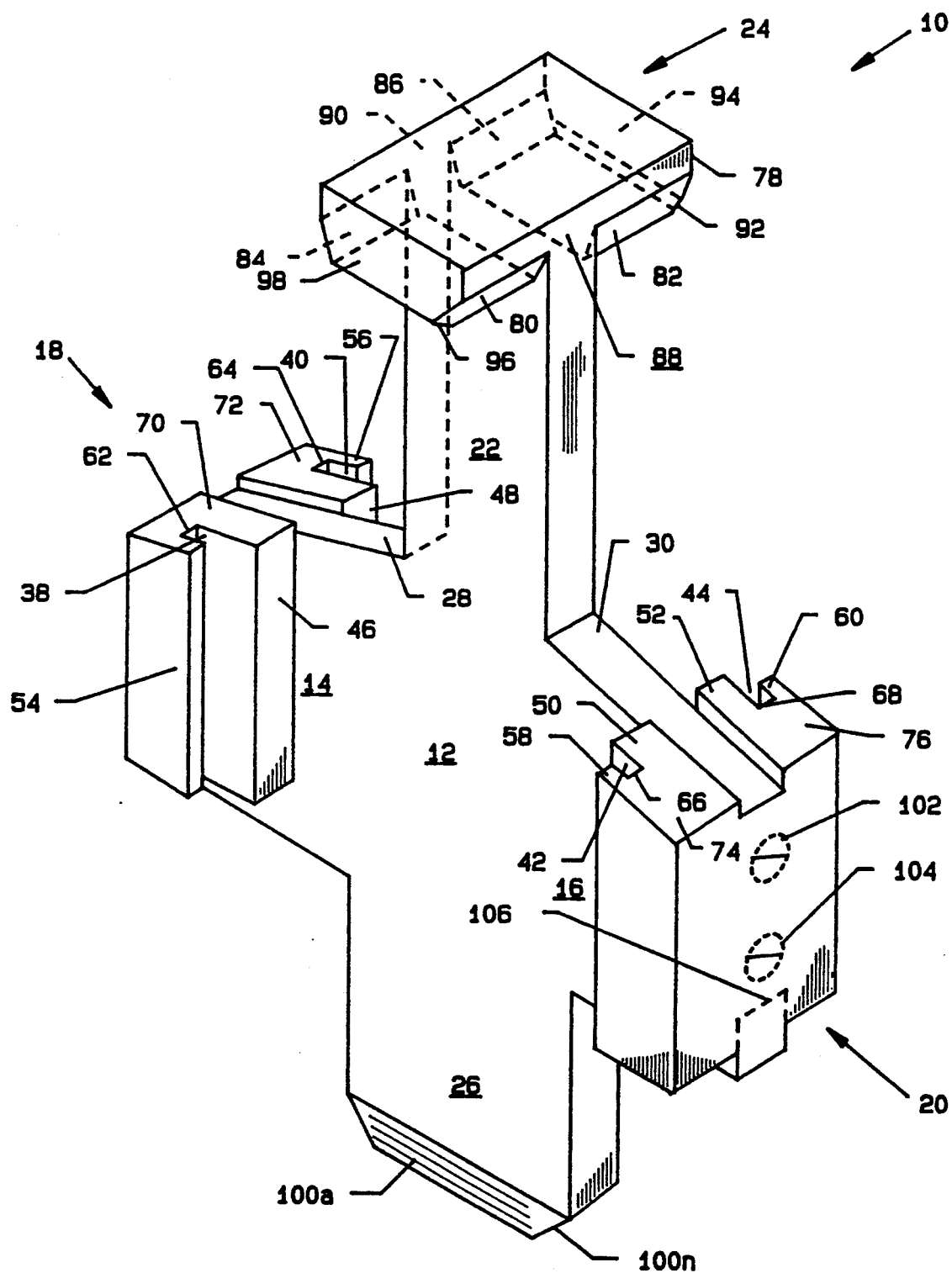
FIG. 1 illustrates a perspective view of a wafer carrier holder for wafer substrate carriers, the present invention.
Figure 3:
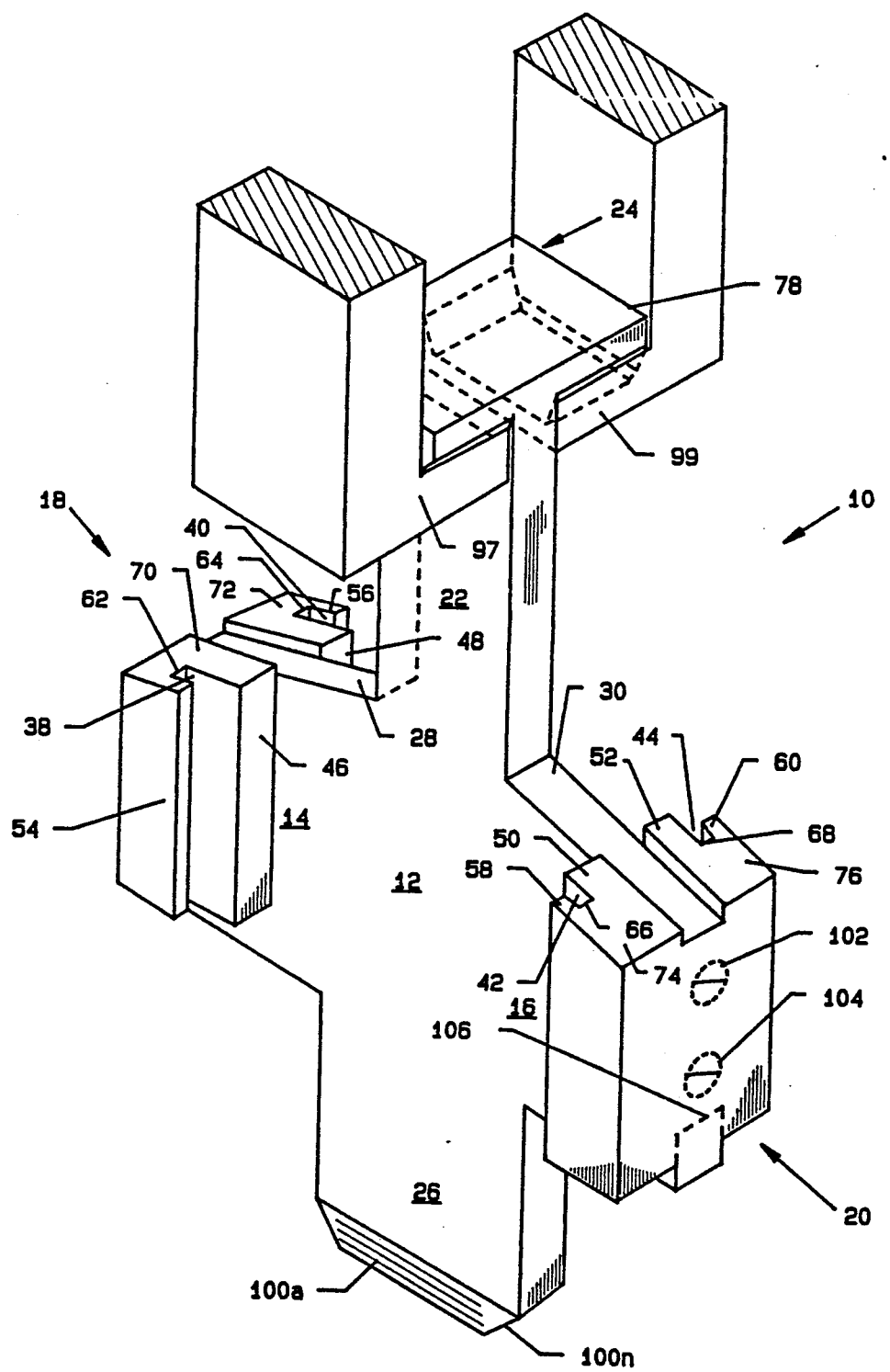
FIG. 3 illustrates the wafer carrier holder being picked up by a robotic arm.

FIG. 1 illustrates a perspective view of a wafer carrier holder 10 for carriage, processing and fabrication of wafer processing carriers, such as for substrates or wafers. The wafer carrier holder 10 is constructed of a suitable processing polymer such as a fluorocarbon such as Teflon, and is of one piece or a welded or fused one-piece construction. The wafer carrier holder includes a central base 12 from which additional members extend, both vertically and horizontally. Opposed horizontal members 14 and 16 extend between the central base 12 and opposing fingered members 18 and 20. A vertical handle support member 22 extends upwardly between the central base 12 and a handle 24. Another vertical member 26 extends downwardly in opposition to the vertical handle support member 22 to serve as a base for the wafer carrier holder 10. The upper planar edges 28 and 30 of the horizontal members 14 and 16 bevel downwardly and outwardly from the vertical handle support member 22 to aid in chemical fluid flow and run-off from the wafer carrier holder 10. Opposing and like fingered members 18 and 20 are vertically aligned to grasp and grip the wafer or substrate processing carrier. Fingered members 18 and 20 include vertically aligned wafer carrier accommodation channels 38, 40, 42 and 44 where channels 38 and 42 accommodate a wafer carrier, and channels 40 and 44 accommodate a wafer carrier on opposing sides of the opposed horizontal members 14 and 16. The accommodation channels 38-44 are spaced at a finite distance from the opposed horizontal members 14 and 16 by rectangular like stops 46, 48, 50 and 52 which form a portion of the walls of the channels 38-44. This spacing maintains a distance between the wafer cassettes and the central base 12 and the opposed horizontal members 14 and 16 so that component parts of held wafer cassettes do not contact the opposed horizontal members 14 and 16 and the central base 12. Rectangular like members 54, 56, 58 and 60 also aid to form the channels 38-44. Channels 38-44 also include vertical surfaces 62-68 between stops 46-52 and rectangular members 54-60, respectively. Opposing fingered members 18 and 20 include beveled top surfaces 70-76 to further assist in fluid runoff. Handle 24, in the form of a symmetric "T", is located perpendicularly to and at the upper portion of the vertical handle support member 22, the top of the handle. The upper handle member 78 is essentially rectangular shaped with aligned beveled edges 80 and 82 and aligned beveled edges 84 and 86 intersecting the vertical handle support member 22 and the vertical edges 88 and 90 of the upper handle member 78. Beveled edges 80-86 align in basket end effectors as illustrated in FIG. 3 and also aid in chemical runoff. A bevel 92 on the upper handle member 78 extends between bevels 82 and 86 and intersects the vertical edge 94. Another bevel 96 on the upper handle member 78 extends between the bevels 80 and 84 and intersects the vertical edge 98. Bevels 92 and 96 aid and assist in chemical runoff. A plurality of beveled edges 100a-100n are positioned about the lower portion of the vertical member 26 to aid in chemical runoff. Optional screws 102 and 104 and a channel 106 are also illustrated where with fingered members 20 and 18 can be molded separately and fastened to the ends of the opposed horizontal members 14 and 16.

Figure 2:
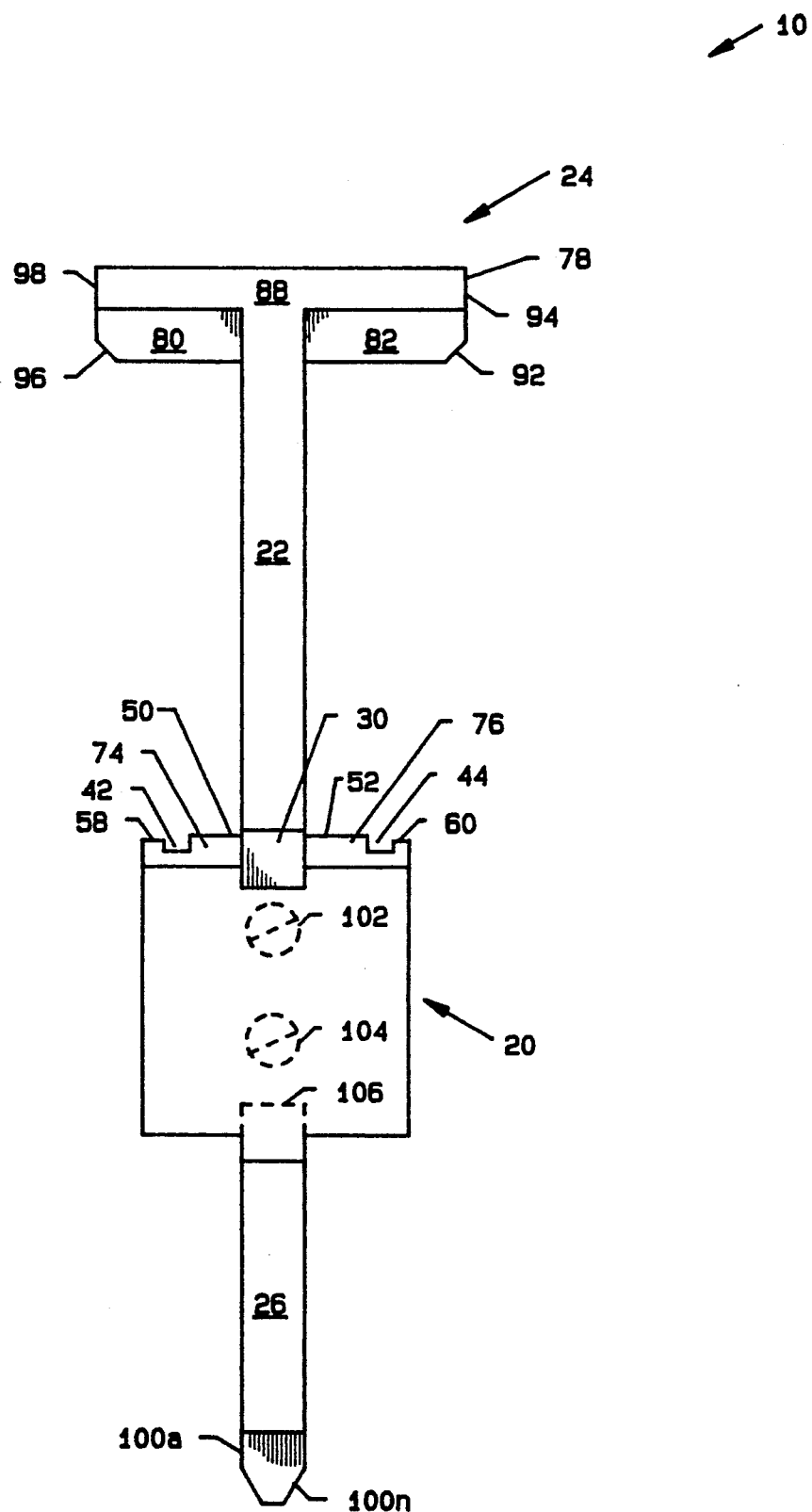
FIG. 2 illustrates a side view of the wafer carrier holder.

FIG. 2 illustrates a side view of the wafer carrier holder 10 where all numerals correspond to those elements previously described. Illustrated in particular are the plurality of beveled edges 100a-100n about the lower portion of the vertical member 26.

FIG. 3 illustrates the wafer carrier holder 10 being picked up by basket end effectors 97 and 99 which are "V"-shaped to accommodate the similar angled undersides of the handle 24. All other numerals correspond to those elements previously described.

Figure 4:
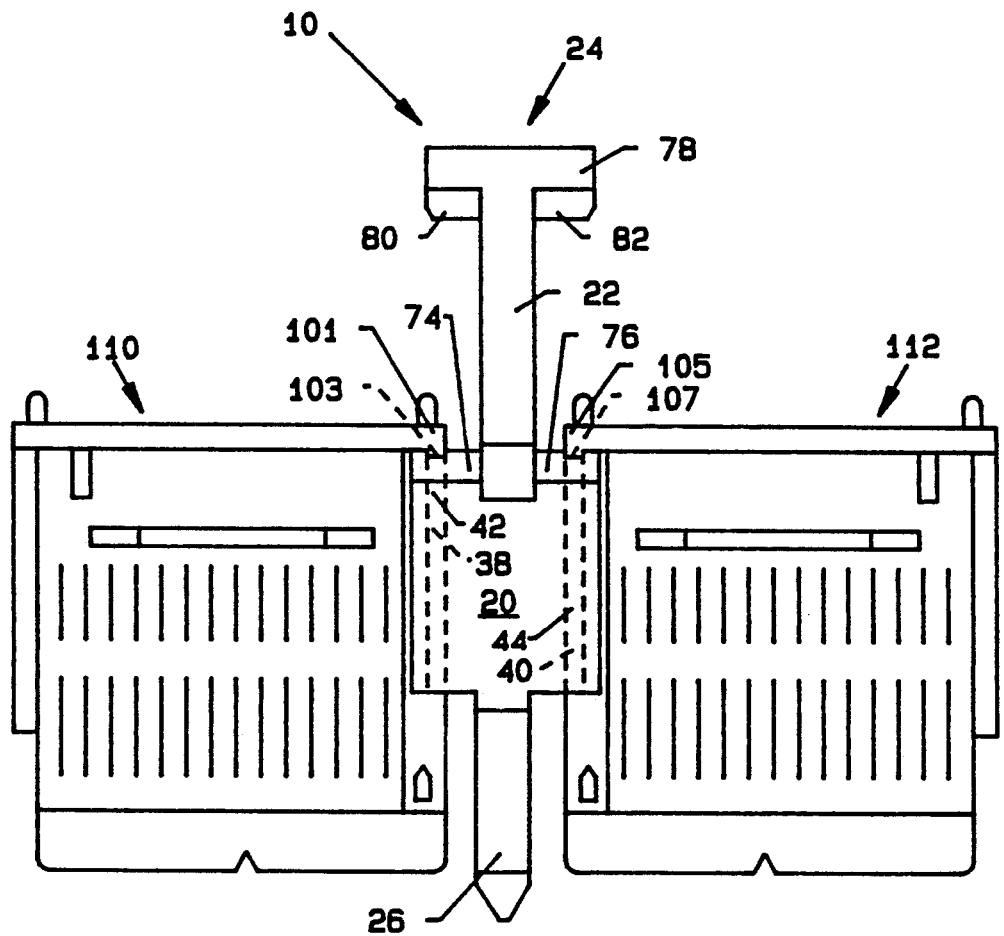
FIG. 4 illustrates the wafer carrier holder engaging wafer carriers.

FIG. 4 illustrates wafer carrier holder 10 engaging wafer carriers 110 and 112 where all numerals correspond to those elements previously described. Wafer cassette accommodation channels 38 and 42 of FIG. 1 engage tabs on the wafer carrier 110. The accommodation channels 40 and 44 of FIG. 1 engage tabs on a wafer carrier 112. Horizontal tab members 101, 103, 105 and 107 of the wafer carriers 110 and 112 engage beveled surfaces 70, 72, 74, and 76 of the opposing fingered members 18 and 20 which act as stops providing for vertical fixation of the wafer carriers 110 and 112 in the fingered members 18 and 20.

Figure 5:
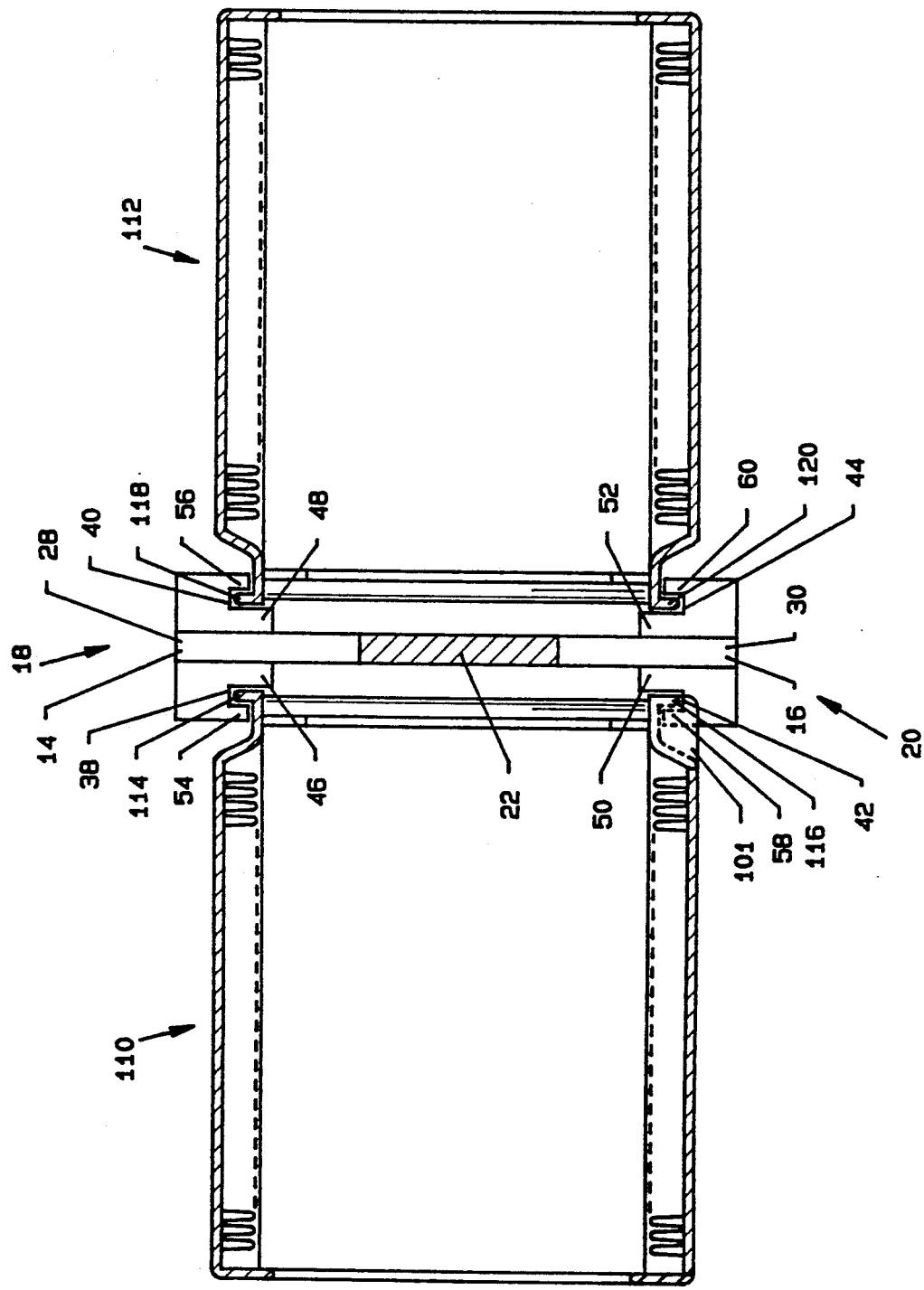
FIG. 5 illustrates a top sectional view of the wafer carrier holder engaging wafer carriers.

FIG. 5 illustrates a top sectional View of FIG. 4 where the wafer carrier holder 10 is gripping wafer carriers 110 and 112. Vertically aligned tab members 114 and 116 of the wafer carrier 110 are slidingly accommodated by channels 38 and 42 and the vertically aligned tab members 118 and 120 of the wafer carrier 112 are slidingly accommodated by channels 40 and 44, respectively, of the opposing fingered members 18 and 20.

MODE OF OPERATION

The wafer carrier holder 10 is utilized with robotic handling equipment, and preferably is of a one-piece polymer member, such as Teflon. The polymer can be a plurality of sections welded together to form the one-piece member for the wafer carrier holder.

Various modifications can be made to the present invention without departing from the apparent scope hereof.

I claim:

1. In combination, a wafer carrier holder, end effectors and wafer carriers comprising:
   a. the wafer carrier including tabs for engaging a gripping means of said wafer carrier holder;
   b. said wafer carrier holder comprising a central member including horizontal members with opposing gripping means affixed thereto, said gripping means spacing said wafer carrier from said central member, said gripping means including first and second opposing vertical channels for slidably receiving the tabs of the wafer carrier, a downwardly extending vertical member from said central member, an upward extending handle support member from said central member, and opposing beveled surface means extending outwardly from said handle support member; and,
   c. said end effectors including means for engaging said opposing beveled surface means of said wafer carrier holder.

* * * * *